(12) United States Patent
Chu et al.

(10) Patent No.: US 11,396,610 B2
(45) Date of Patent: Jul. 26, 2022

(54) METHOD OF PRINTING ULTRANARROW LINE

(71) Applicant: National Research Council of Canada, Ottawa (CA)

(72) Inventors: Ta-Ya Chu, Ottawa (CA); Zhiyi Zhang, Ottawa (CA); Ye Tao, Ottawa (CA)

(73) Assignee: NATIONAL RESEARCH COUNCIL OF CANADA, Ontario (CA)

(*) Notice: Subject to any disclaimer, the term of this patent is extended or adjusted under 35 U.S.C. 154(b) by 0 days.

(21) Appl. No.: 15/740,514

(22) PCT Filed: Jun. 30, 2016

(86) PCT No.: PCT/CA2016/050767
§ 371 (c)(1),
(2) Date: Dec. 28, 2017

(87) PCT Pub. No.: WO2017/004702
PCT Pub. Date: Jan. 12, 2017

(65) Prior Publication Data
US 2018/0187035 A1    Jul. 5, 2018

Related U.S. Application Data

(60) Provisional application No. 62/188,579, filed on Jul. 3, 2015.

(51) Int. Cl.
*H05K 3/12* (2006.01)
*C09D 11/52* (2014.01)
(Continued)

(52) U.S. Cl.
CPC ............ *C09D 11/52* (2013.01); *C09D 11/033* (2013.01); *C09D 11/037* (2013.01);
(Continued)

(58) Field of Classification Search
None
See application file for complete search history.

(56) References Cited

U.S. PATENT DOCUMENTS 5,602,047 A    2/1997 Tsai
5,726,065 A *  3/1998 Szlufcik .......... H01L 31/022425
                                                    136/256
(Continued)

FOREIGN PATENT DOCUMENTS

CA    2 593 884 A1    1/2008
EP    0402942         12/1990
(Continued)

OTHER PUBLICATIONS

Abbel et al., "Narrow Conductive Structures with High Aspect Ratios Through Single-Pass Inkjet Printing and Evaporation-Induced Dewetting", Advanced Engineering Materials, vol. 17, No. 5, (Aug. 14, 2014).*
(Continued)

*Primary Examiner* — Brian K Talbot
(74) *Attorney, Agent, or Firm* — Wegman Hessler

(57) ABSTRACT

Disclosed is a method of printing an ultranarrow line of a functional material. The method entails providing a substrate having an interlayer on the substrate and printing the ultranarrow line by depositing ink on the interlayer of the substrate, the ink comprising the functional material and a solvent mixture that partially dissolves the interlayer on the substrate to cause the ink to shrink and sink into the interlayer on the substrate thereby reducing a width of the line.

11 Claims, 5 Drawing Sheets

(51) Int. Cl.
| | |
|---|---|
| *C09D 11/322* | (2014.01) |
| *C09D 11/033* | (2014.01) |
| *C09D 11/037* | (2014.01) |
| *C09D 11/36* | (2014.01) |
| *H01L 21/288* | (2006.01) |

(52) U.S. Cl.
CPC ............ *C09D 11/322* (2013.01); *C09D 11/36* (2013.01); *H01L 21/288* (2013.01); *H05K 3/1208* (2013.01); *H05K 3/125* (2013.01); *H05K 3/1241* (2013.01); *H05K 2201/0145* (2013.01)

(56) References Cited

U.S. PATENT DOCUMENTS

| | | | |
|---|---|---|---|
| 5,989,944 | A | 11/1999 | Yoon |
| 7,223,700 | B2 | 5/2007 | Wong |
| 7,615,483 | B2 | 11/2009 | Daniel et al. |
| 7,745,101 | B2 | 6/2010 | Tutt et al. |
| 7,745,202 | B2 | 6/2010 | Higa |
| 7,749,396 | B2 | 7/2010 | Chow |
| 8,278,138 | B2 | 10/2012 | Yang |
| 8,465,905 | B2 | 6/2013 | Schuster |
| 2005/0153078 | A1* | 7/2005 | Bentley .................. C23C 18/30 427/443.1 |
| 2006/0032437 | A1 | 2/2006 | McMacklin et al. |
| 2006/0037935 | A1* | 2/2006 | Aoki ................ H01L 21/28123 216/13 |
| 2006/0163744 | A1* | 7/2006 | Vanheusden ........... B82Y 30/00 257/773 |
| 2007/0098883 | A1* | 5/2007 | Itoh ......................... C09D 5/24 427/180 |
| 2007/0190673 | A1 | 8/2007 | Ko |
| 2009/0145640 | A1 | 6/2009 | Toyoda |
| 2009/0181172 | A1 | 7/2009 | Parpia et al. |
| 2011/0094774 | A1* | 4/2011 | Yang ................... H05K 1/0298 977/932 |
| 2013/0165549 | A1 | 6/2013 | Wagman et al. |
| 2013/0213817 | A1 | 8/2013 | Lo |
| 2017/0130085 | A1* | 5/2017 | Kondo ..................... H01B 1/22 |

FOREIGN PATENT DOCUMENTS

| | | |
|---|---|---|
| EP | 1933393 | 6/2008 |
| EP | 2 257 969 A2 | 2/2009 |
| JP | 63283092 A | 11/1988 |
| JP | H07273009 | 10/1995 |
| JP | 2003309085 A | 10/2003 |
| JP | 2008182211 A | 8/2008 |
| JP | 2008294391 | 12/2008 |
| JP | 2010283194 A | 12/2010 |
| JP | 2013065633 | 4/2013 |
| WO | 2006113400 | 10/2006 |
| WO | 2009108771 | 9/2009 |
| WO | 2011021763 | 2/2011 |
| WO | 2014072016 | 5/2014 |

OTHER PUBLICATIONS

Laurila et al., Interfacial Compatibility in Microelectronics, Springer, (2012), pp. 201-204.*
International Search Report and Written Opinion dated Jan. 12, 2017 for PCT/CA2016/050767 filed Jun. 30, 2016.
International Search Report and Written Opinion dated Jan. 12, 2017 for PCT/CA2016/050768 filed Jun. 30, 2016.
International Search Report and Written Opinion dated Jan. 12, 2017 for PCT/CA2016/050769 filed Jun. 30, 2016.
International Preliminary Report on Patentability for International Patent Application No. PCT/CA2016/050767 dated Jan. 9, 2018.
International Search Report and Written Opinion dated Sep. 12, 2016 for PCT/CA2016/050767 filed Jun. 30, 2016.
Abbel, et al., "Narrow Conductive Structures with High Aspect Ratios Through Single-Pass Inkjet Printing and Evaporation-Induced Dewetting", Advanced Engineering Materials, DOI: 10.1002/adam.201400339, pp. 1-5, 2014.
Dockendorf, et al., "Size reduction of nanoparticle ink patterns by fluid-assisted dewetting", Applied Physics Letters 88, 2006.
L. Jacot-Descombes, et al., "Fabrication of epoxy spherical microstructures by controlled drop-on-demand inkjet printing", Journal of Micromechanics and Microengineering, pp. 1-9, 2012.
Nguyen, et al., "An approach for controlling printed line-width in high resolution roll-to-roll gravure printing", Journal of Micromechanics and Microengineering, pp. 1-11, 2013.
Soltman, et al., "Inkjet-Printed Line Morphologies and Temperature Control of the Coffee Ring Effect", Langmuir 2008, 24, pp. 2224-2231.
Soltman, et al., "Methodology for Inkjet Printing of Partially Wetting Films", Langmuir Article, 2010, pp. 15686-15693.
Van Osch, et al., "Inkjet Printing of Narrow Conductive Tracks on Untreated Polymeric Substrates", Advanced Materials, 2008, pp. 343-345.
International Search Report and Written Opinion dated Sep. 14, 2016 for PCT/CA2016/050768 filed Jun. 30, 2016.
Yokota et al., "Low-voltage organic transistor with subfemtoliter inkjet source-drain contacts", MRS Communications (2011), pp. 3-6.
Yin et al., "Inkjet printing for flexible electronics: Materials, processes and equipments", Chinese Science Bulletin, Oct. 2010, vol. 55, No. 30, pp. 3383-3407.
Tang, et al., "Inkjet Printing Narrow Fine Ag Lines on Surface Modified Polymeric Films", Department of Electronic Engineering, Shanghai Jiao Tong University, China, 2013 IEEE, pp. 1171-1174.
Suzuki et al., "All-printed Organic TFT Backplanes for Flexible Electronic Paper", International Symposium on Electronic Paper, The Imaging Society of Japan, 2010, pp. 1-6.
Sirringhaus et al., "High-Resolution Inkjet Printing of All-Polymer Transistor Circuits", Science, vol. 290, Dec. 15, 2000, pp. 2123-2126.
Sele, et al., "Lithography-Free, Self-Aligned Inkjet Printing with Sub-Hundred-Nanometer Resolution", Advanced Materials, 2006, 17, No. 8, Apr. 2018, pp. 997-1001.
Rogers, et al., "Printing Process Suitable for Reel-to-Reel Production of High-Performance Organic Transistors and Circuits", Advanced Materials, 1999, 11, No. 9, pp. 741-745.
SIJ Technology Inc. Super fine inkjet printer, https://web.archive.org/web/20141204024608/http://www.sijtechnology, (no date available).
Park, et al., "High-resolution electrohydrodynamic jet printing", Nature Publishing Group, 2007, pp. 782-789.
Li, "OTFT Integration Strategies," pp. 56-100., (no date available).
Kang, et al., "Self-aligned flexible all-polymer transistor: Ultraviolet printing", Applied Physics Letters 93, 2008, pp. 1-3.
Jeong et al., "Self-Defined Short Channel Formation With Micromolded Separator and Inkjet-Printed Source/Drain Electrodes in OTFTs", IEEE Electron Device Letters, vol. 32, No. 12, Dec. 2011, pp. 1758-1760.
Cheng, et al., "Effect of PVP-coated silver nanoparticles using laser direct patterning process by photothermal effect", Microelectronic Engineering 88, 2011, pp. 929-934.
Doggart et al., "Facile Inkjet-Printing Self-Aligned Electrodes for Organic Thin-Film Transistor Arrays with Small and Uniform Channel Length", Applied Materials and Interfaces, 2010, pp. 2189-2192.
Frederix et al., "Biosensing Based on Light Absorption of Nanoscaled Gold and Silver Particles", Analytical Chemistry, vol. 75, No. 24, Dec. 15, 2003, pp. 6894-6900.
Kang et al., "Sintering of Inkjet-Printed Silver Nanoparticles at Room Temperature Using Intense Pulsed Light", Journal of Electronic Materials, vol. 40, No. 11, 2011, pp. 2268-2277.
Kumpulainen et al., "Low temperature nanoparticle sintering with continuous wave and pulse lasers", Optics & Laser Technology, 43, 2011, pp. 570-576.

(56) References Cited

OTHER PUBLICATIONS

Lesyuk et al., "Low-energy pulsed laser treatment of silver nanoparticles for interconnects fabrication by ink-jet method", Microelectronic Engineering, 88, 2011, pp. 318-321.
Palfinger et al., "Fabrication of n- and p-Type Organic Thin Film Transistors with Minimized Gate Overlaps by Self-Aligned Nanoimprinting", Advanced Materials, 2010, 22, pp. 5115-5119.
Roy et al., "Self-aligned Inkjet Printing of TFTs/Circuits", IEEE 2012, Microsystems Center, Tyndall National Institute, University College Cork, Lee Maltings, Dyke Parade, Cork, Ireland, pp. 1-4.
Tseng et al., "High-speed organic transistors fabricated using a novel hybrid-printing technique", Organic Electronics 12, 2011, pp. 1120-1125.
Wikipedia—Photonic curing, http://en.wikipedia.org/wiki/Photonic_curing, Oct. 2014, pp. 1-3.
International Preliminary Report on Patentability for International Patent Application No. PCT/CA2016/050769 dated Jan. 9, 2018.
International Search Report and Written Opinion dated Sep. 14, 2016 for PCT/CA2016/050769 filed Jun. 30, 2016.
Office Action dated Sep. 1, 2020 received in related Japanese Patent Application No. 2017-568333; 6 pages.

\* cited by examiner

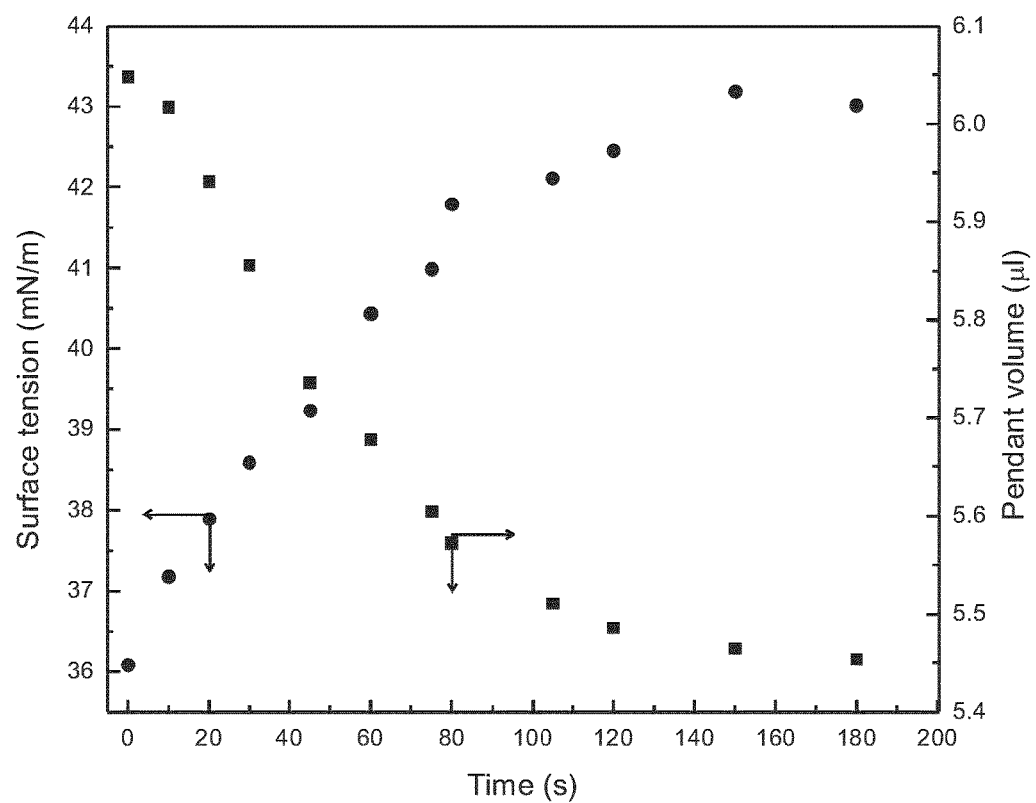
*Figure 1*
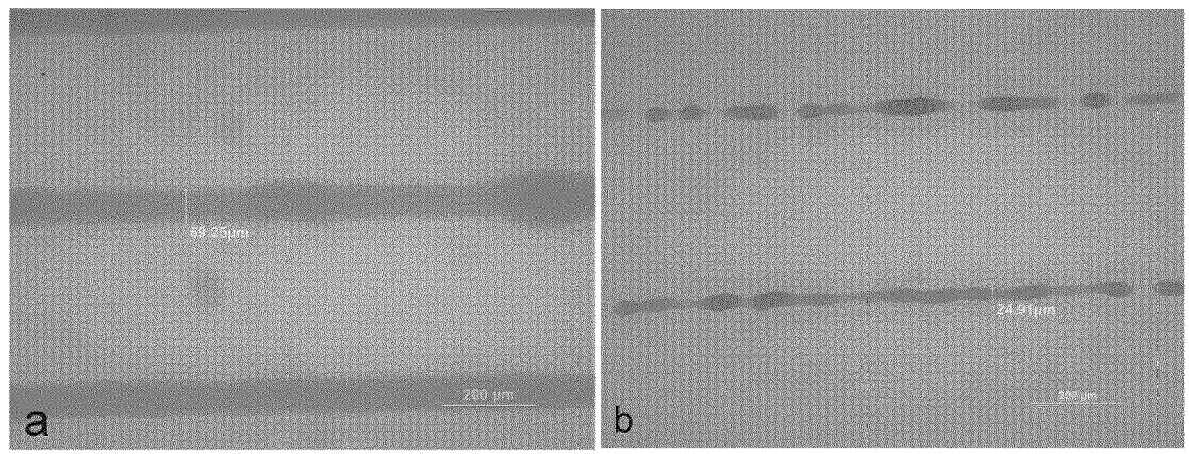
*Figure 2A*          *Figure 2B*

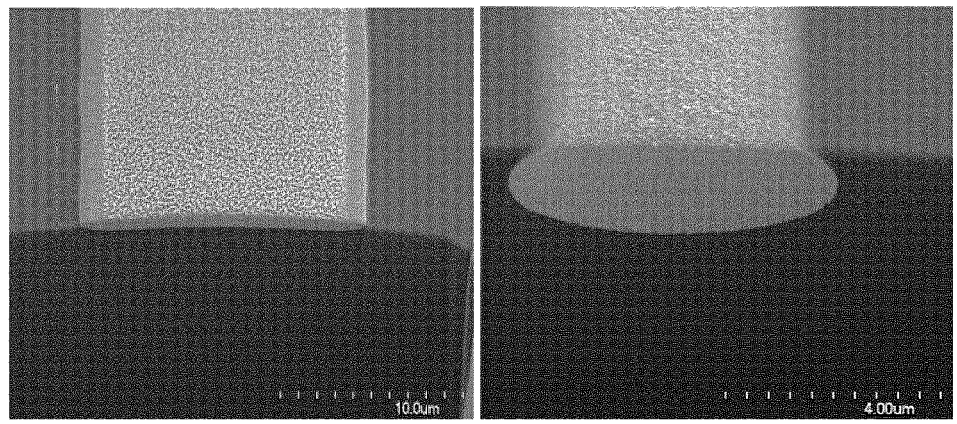
*Figure 5A*  *Figure 5B*
Printed patterns
Shrinkage process
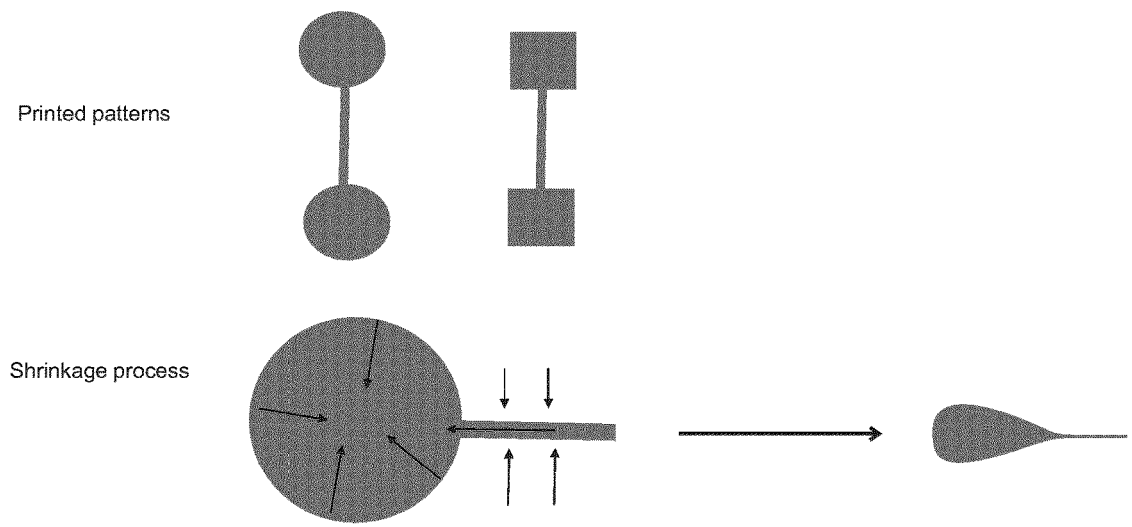
*Figure 6*

METHOD OF PRINTING ULTRANARROW LINE

TECHNICAL FIELD

The present disclosure relates generally to fabrication techniques for printable electronic devices and, in particular, to a technique for printing a narrow line in fabricating a printable electronic device.

BACKGROUND

Printing on flexile and low-cost substrates is an increasingly popular method of fabricating low-cost electronic devices. Nevertheless, the features that are achievable using conventional printing processes are still too large in comparison with those obtained by traditional photolithographic techniques. The narrowest conductive lines that can be directly printed with a commercial picoliter volume of print head, for instance, were reported to be ~30 μm wide. It is critically important to reduce the feature size, such as line width, in order to be able to print high-performance electronic devices.

When printing on smooth and nonporous substrates, a line width of around 30 μm to 50 μm can usually be obtained using conventional printing technology. The line width is primarily dictated by the surface energy difference between the substrate surface and ink. By controlling this difference, and other parameters, such as ink viscosity, drying process, substrate temperature, surface energy and surface tension, a line width of 15 μm can be printed using a commercial print head with a droplet volume of around 1 pl to 10 pl. For scalable printing methods, such as inkjet printing, flexo printing, gravure printing, and screen printing, 10-30 μm is the limit for direct printing. Some new technologies have been developed to print narrower lines, but they require additional steps. The popular ink-bank method, for instance, requires initial patterning of the substrate using a material with desired surface energy to control the ink spread after being printed on the substrate. Other techniques, like electrohydrodynamic jet printing, have been demonstrated to print narrow lines less than 2 μm wide using a femtoliter nozzle. However, electrohydrodynamic jet printing is not scalable for mass production.

Conventional methods of optimizing surface tension difference, viscosity, drying process and other parameters can only reduce the line width down to about 15 μm. While a patterning step could reduce the printed line width to a submicrometer scale, this patterning step also is costly and introduces non-functional features which reduce integration density.

Accordingly, a new or improved printing technique would be highly desirable in order to print ultranarrow lines.

SUMMARY

The present disclosure provides a new method of printing ultranarrow lines by exploiting the interaction between an ink containing a solvent mixture and the substrate (or interlayer) upon which the ink is deposited. The solvent mixture slightly dissolves the substrate (or interlayer) while its evaporation/drying causes shrinkage of the line width. The resulting line has a sunken or embedded profile.

Accordingly, one inventive aspect of the present disclosure is a method of providing a substrate having an interlayer on the substrate and printing the ultranarrow line by depositing ink on the interlayer of the substrate, the ink comprising the functional material and a solvent mixture that partially dissolves the interlayer on the while its evaporation/drying causes the ink to shrink and sink into the interlayer on the substrate thereby reducing a width of the line. In one embodiment, the surface energy may change during evaporation/drying.

This summary is provided to highlight certain significant inventive aspects but is not intended to be an exhaustive or limiting definition of all inventive aspects of the disclosure. Other inventive aspects may be disclosed in the detailed description and drawings.

BRIEF DESCRIPTION OF THE DRAWINGS

Further features and advantages of the present technology will become apparent from the following detailed description, taken in combination with the appended drawings, in which:

FIG. 1 depicts the surface tension and pendant drop volume of the mixture of ethanol, ethylene glycol and glycerin as a function of time at 23° C., FIG. 2A depicts freshly printed lines of red ink (based on a mixture of ethanol, ethylene glycol, and glycerol) that have been inkjet-printed on PET (e.g. Melinex ST 505);

FIG. 2B depicts the lines after being thermally treated at 70° C. for 5 minutes;

FIG. 5A shows a cross-sectional scanning electron microscope (SEM) image of silver nano ink printed on uncrosslinked SU-8 having a shrunk line width of 15 μm in which the image was taken at a 45-degree tilt angle, so that the Y-axis should be divided by 0.7 for the height calibration;

FIG. 5B shows a cross-sectional scanning electron microscope (SEM) image of silver nano ink printed on uncrosslinked SU-8 having a shrunk line width of 5 μm in which the image was taken at a 45-degree tilt angle, so that the Y-axis should be divided by 0.7 for the height calibration;

FIG. 6 illustrates a draining mechanism to further shrink the line width in which the red area represents the ink-covered area and the arrows indicate the ink shrinkage direction.

It will be noted that throughout the appended drawings, like features are identified by like reference numerals.

DETAILED DESCRIPTION

Figure 3:
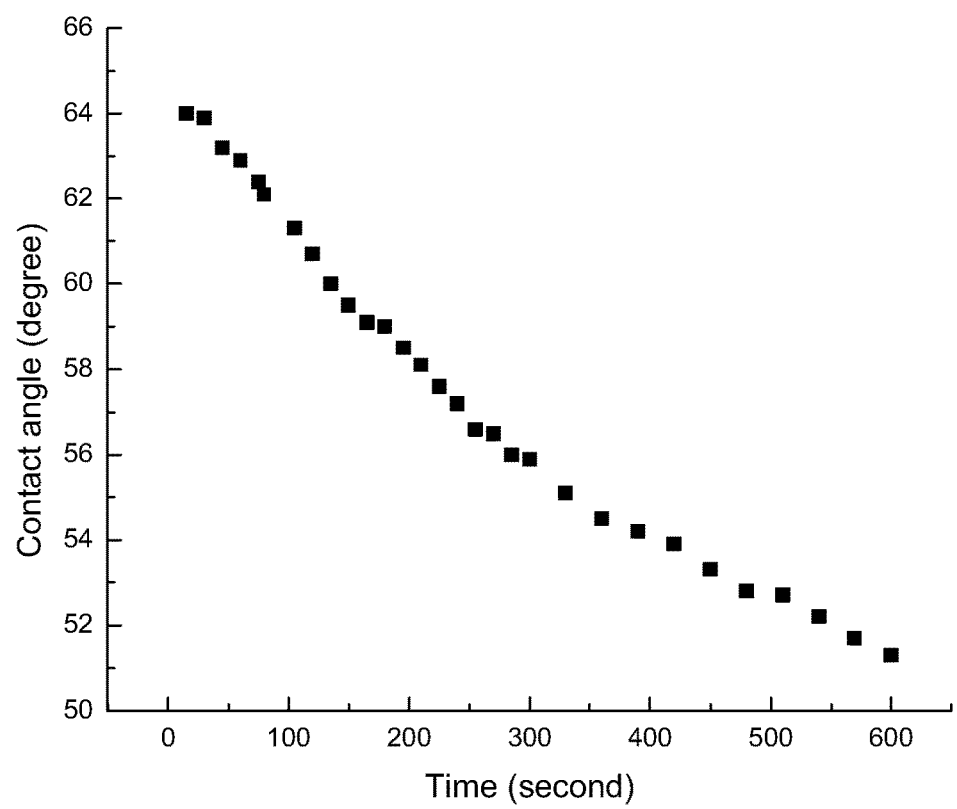
FIG. 3 shows the contact angle of ethylene glycol and glycol mixture on uncrosslinked SU-8 for which the ratio of ethylene glycol to glycol is the same as that in the mixture used in FIG. 1 and for which the SU-8 is a photoresist epoxy spin coated on PET film and soft backed only without the exposure to UV and hard baked for crosslinking.

Disclosed herein is a method of printing an ultranarrow line of a functional material such as an electrically conductive ink. The method entails, in general, steps, acts or operations of providing a substrate having an interlayer on the substrate and printing the ultranarrow line by depositing ink on the interlayer of the substrate, the ink comprising the functional material and a solvent mixture that partially dissolves the interlayer on the substrate, causing the ink to shrink and sink into the interlayer on the substrate thereby reducing a width of the line. The surface energy of the solvent mixture may change during evaporation/drying. In one embodiment, the functional material is an electrically conductive ink such as, for example, a silver nanoparticle ink. The functional material may be a conductor, semiconductor, dielectric, electroluminescent, photovoltaic, or any other electronic function. In one embodiment, the solvent is a mixture of ethanol, ethylene glycol and glycerol. In another embodiment, the solvent is a mixture of ethanol, ethylene glycol and glycerol, the substrate is polyethylene terephthalate (PET) and the interlayer is SU-8 being composed of a fully epoxidized bisphenol-A/formaldehyde novolac co-polymer. The line width may be further narrowed by thermally treating the ink, interlayer and substrate after printing. For example, the ink, interlayer and substrate are thermally treated at 70° C. for 5 minutes or thermally treated at 50° C. then at 75° C.

Further narrowing of the line may be achieved by draining ink longitudinally along the line by depositing larger areas of ink at each end of the line, the larger areas having a free energy lower than that of the line, thereby causing the ink to drain toward each of the larger areas during the shrinking process thus further reducing the width of the line.

The present method can achieve a height-to-width ratio of the line of 0.11 or greater. Printing, e.g. performed using an inkjet printer, can achieve a line width below 10 µm. This is very useful for printing a gate of a transistor of a printable electronic device.

In one embodiment, the method further entails controlling a surface tension of the ink while drying to remain less than a surface tension of the substrate upon which the ink is drying. The interaction between the selected ink and interlayer/substrate reduces the width of the printed line. In some cases, it achieves a reduction in width down to 1.5 to 3 µm. The ink increases its surface energy during the drying process, leading to reduced line width. The ink also contains solvents which can partially dissolve the selected interlayer/substrate, thereby causing the printed feature to sink or embed into the interlayer/substrate during the drying process, which helps to further reduce the line width.

In embodiments of this method, the ink is selected so that the ink can wet well on the substrate and form stable line edges, and so that a de-wetting process for the deposited ink can then cause the width of the printed line to shrink on the substrate in a controlled fashion under the influence of the surface tension of the ink and the interaction between ink and interlayer/substrate, i.e. the localized, partial dissolving of the substrate/interlayer by the solvent in the ink. Therefore, in at least some embodiments, the combination of the selected ink solvent(s) and solubility of interlayer/substrate is critical in order to obtain an ultranarrow line width below 10 µm.

The ink can change its wetting property on a substrate after it is deposited on the substrate. One example is to use a solvent mixture that contains a solvent with low surface tension and low boiling point. The mixture has a lower surface energy to wet a substrate initially but gradually lose its wettability as the volatile solvent evaporates and the ink surface energy increases. FIG. 1 demonstrates the change of surface tension and pendant drop volume of a mixture of ethanol, ethylene glycol and glycerol with time. Table 1 lists the surface tension and boiling point of the some of the solvents that may be used in this method:

| Solvent | Boiling Point (° C.) | Surface Tension (mN/m, @ 20° C.) |
|---|---|---|
| Ethanol | 78 | 22.1 |
| Ethylene glycol | 173 | 47.7 |
| Glycerol | 290 | 64.0 |

When a red ink was formulated with the above solvent mixture and printed on a PET film, stable lines, around 79 µm wide, could be formed (as shown by way of example in FIG. 2A). After the printed film was heated to 70° C. for 5 minutes, however, the ink line width shrank to around 20 µm (as shown by way of example in FIG. 2B). The ink had an initial surface tension of 37 mN/m, which was sufficiently smaller than that of PET (46 mN/m) to meet the wetting condition on PET, and thus could form stable lines on PET. The value was measured to be 43 mN/m after the ink partially lost its ethanol through evaporation. When there was no ethanol left in the ink, the ink had a surface tension of 48 mN/m. Clearly, the evaporation of ethanol from thermal treatment changed the wetting condition of the ink on PET and caused the lines to shrink.

To print an electronic device, the ink must be able to form well-defined lines when printed on the selected substrate. This is to ensure that identical post-printing shrinkage can happen at the same time along each line edge. In other words, the shrunk lines should have substantially uniform width and no breakage lengthwise. When a pattern with more than two lines is printed, the condition ensures that the pattern could maintain its design after the width of the printed lines are shrunk. Note that bulged or discontinuous lines, or even aligned drops, will appear if de-wetting happens before stable lines are formed.

The line shrinkage in the post-printing process is controlled at a desired rate along each line edge. This is also to ensure that the lines shrunk by this method have substantially uniform width and have no breakage along their entire length. When the shrinkage rate is not uniform along a line edge, the section that shrinks more slowly will have a larger area and thus lower free energy than the one that shrinks faster. As such, ink in the faster shrinking section would flow to the slower one, especially when the shrinkage rate is high, resulting in bulged or discontinuous lines. This uneven-rate-caused effect can be intensified when the shrinkage rate is high. This situation should be avoided.

For solvent-evaporation-based shrinkage, its speed can be controlled through the speed of solvent evaporation and proper use of ink viscosity. Choosing a suitable post-printing process temperature is a simple and effective way. While a high temperature may lead to fast de-wetting and fast line shrinkage due to rapid solvent evaporation and low ink viscosity, the high ink viscosity at low temperature may limit the degree that the shrinkage can be proceed. The bulging and line breakage of red ink on PET as seen in FIG. 2B can be avoided when the post-printing process temperature is reduced to 62° C. Also, if the printed lines are initially exposed to 50° C. for a short period before being heated at 75° C., the bulging and breakage can be avoided and same level of shrinkage can be achieved. The reason is that ink viscosity is high and line shrinkage is slow at 50° C. When the solvent is mostly evaporated at 50° C., the ink viscosity is substantially increased and line shrinkage rate becomes moderate at 75° C. Indeed, solvent evaporation can be decoupled with viscosity effect in such a stepwise heating process to effectively control the line shrinkage speed.

The ink solvent can slightly (or partially) dissolve a thin layer of interlayer/substrate. This localized dissolution of the interlayer/substrate by the ink solvent helps ink to spread on the substrate as shown in FIG. 3. This may drag the line edges in opposite directions during shrinkage, and thus substantially reducing the chance for bulging and line breakage. Also, for solvents with high boiling points, which have high surface tension and do not evaporate much, the solvents recede with the line edges. The dissolution can therefore continue in the ink-covered area, sinking the ink into the substrate to a limited degree. This process also provides a mechanism for preventing bulging and line breakage.

Figure 4A:
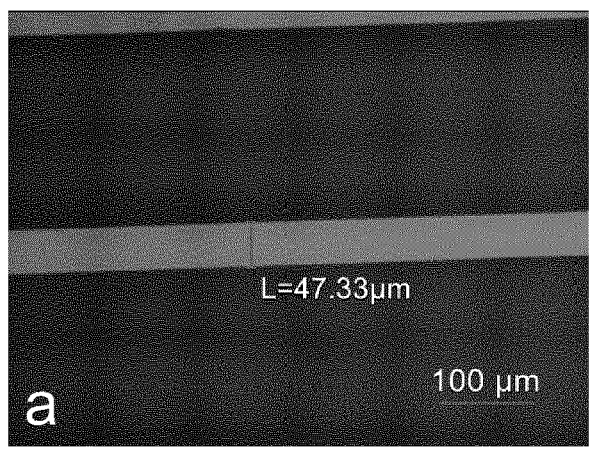
FIG. 4A shows an optical microscope image of silver nano ink freshly printed on uncrosslinked SU-8.
Figure 4B:
FIG. 4B shows an optical microscope image of the silver nano ink on the uncrosslinked SU-8 after being thermally treated at 70° C. for 5 minutes.

Long silver lines, 3 µm wide, were obtained by using the above discussed solvent-substrate dissolution process as shown in FIG. 4. The lines were printed on uncrosslinked SU-8 coated PET as illustrated in FIG. 3 by using a silver nano particle ink based on a solvent mixture, containing ethanol, ethylene glycol and glycol. The lines were 47 µm wide after being inkjet-printed on the substrate and shrank to 3 µm wide after an optimized thermal treatment at 70° C. for 5 minutes. Uniform lines of 3 µm wide and over a centimeter long can be repeatedly obtained using this method. These are the narrowest lines obtained by inkjet printing with a commercial print head having a 10 pl nozzle, without any pre-patterning step, such as ink-banks. 1.5 µm wide lines were achieved by using a diluted ink with a 1 pl print head. These are considered "ultranarrow" in the field of printing and printable electronics. For the purposes of this specification, the term "ultranarrow" means a line width of 10 µm or less. The same ink printed on crosslinked SU-8 cannot wet the surface properly because the surface energy of crosslinked SU-8 is lower than that of the ink. When printing on air plasma-treated crosslinked SU-8, the ink did not show the shrinking phenomenon because the surface energy of the treated surface is always greater than that of the ink even when its surface energy is increased due to the evaporation of volatile solvent. In addition, the ink cannot partially dissolve crosslinked SU-8 either. Therefore, a suitable combination of selected ink (containing suitable solvents) and the selected interlayer/substrate is important to achieve the effect.

The ultranarrow lines obtained using the above method are characterized by a unique cross-sectional profile. Their height/width (H/W) ratios are very high because the narrow width is achieved by the reduction in line width and increase in line height. As the width of a line is shrunk by n times, the corresponding H/W ratio of the line is increased to $n^2$ times the original ratio. The H/W ratio can reach 0.11 or greater when the line width is 17 µm or narrower. This ratio cannot be achieved by one layer printing using any scalable printing process, such as inkjet printing, flexo printing, gravure printing, and screen printing. Indeed, the combination of ultranarrow line width and high H/W ratio is the unique structural feature of the lines printed/processed with the above disclosed method.

The H/W ratio can reach an extremely high value of 0.7 by dissolving the substrate using an ink solvent. A slight dissolution is favoured by the elevated temperature and continues in the area still covered by the ink. As such, the printed line gradually sinks into the substrate as it shrinks. This sinking or embedment process plays an additional and vital role in avoiding line bulging and breakage, even when a line substantially shrinks to become ultranarrow with an extremely high H/W ratio. FIG. 5 shows a scanning electron microscope (SEM) image of the shrunken line. Here, the shrunken line is partially embedded into the SU-8 coating on PET film. The lines are very stable and strongly adhere to the substrate.

Furthermore, even narrower lines, down to 0.45 µm, can be obtained by introducing a draining method. The draining method drains some ink from a line during its shrinkage. Draining is accomplished by placing low free-energy reservoirs at the end of each line as shown by way of example in FIG. 6. In the printing process, more ink can be printed at the end of each line in various shapes, such as circle, oval, square, diamond, etc. When a printed pattern is exposed to the post-printing treatment to shrink the printed feature, all its edges recede in the direction as indicated by the arrows. Simultaneously, part of the ink in the line is also drained to the area at its two ends, which have a free energy lower than the line due to the larger volume. This ink-draining process can cause the line to further shrink. In other words, this draining effect can further diminish the cross-sectional area of the line. The mechanism is superficially similar or analogous to the mechanical drawing of a thick solid wire to a thin one, but is intrinsically different as no external energy is required in the draining and the lines are not elongated.

Silver lines, 0.45 µm wide and 100 µm long, can be obtained repeatedly using this method. The line length is limited by the fact that only a limited amount of ink can be drained from each end of a line. Nevertheless, the length is enough for the lines to be used in many applications such as printing transistors. Again, there is no pre-patterning step required and only one printing and one post printing process are involved in the method, making this technique very useful for the manufacturing of printable electronics.

Figure 7:
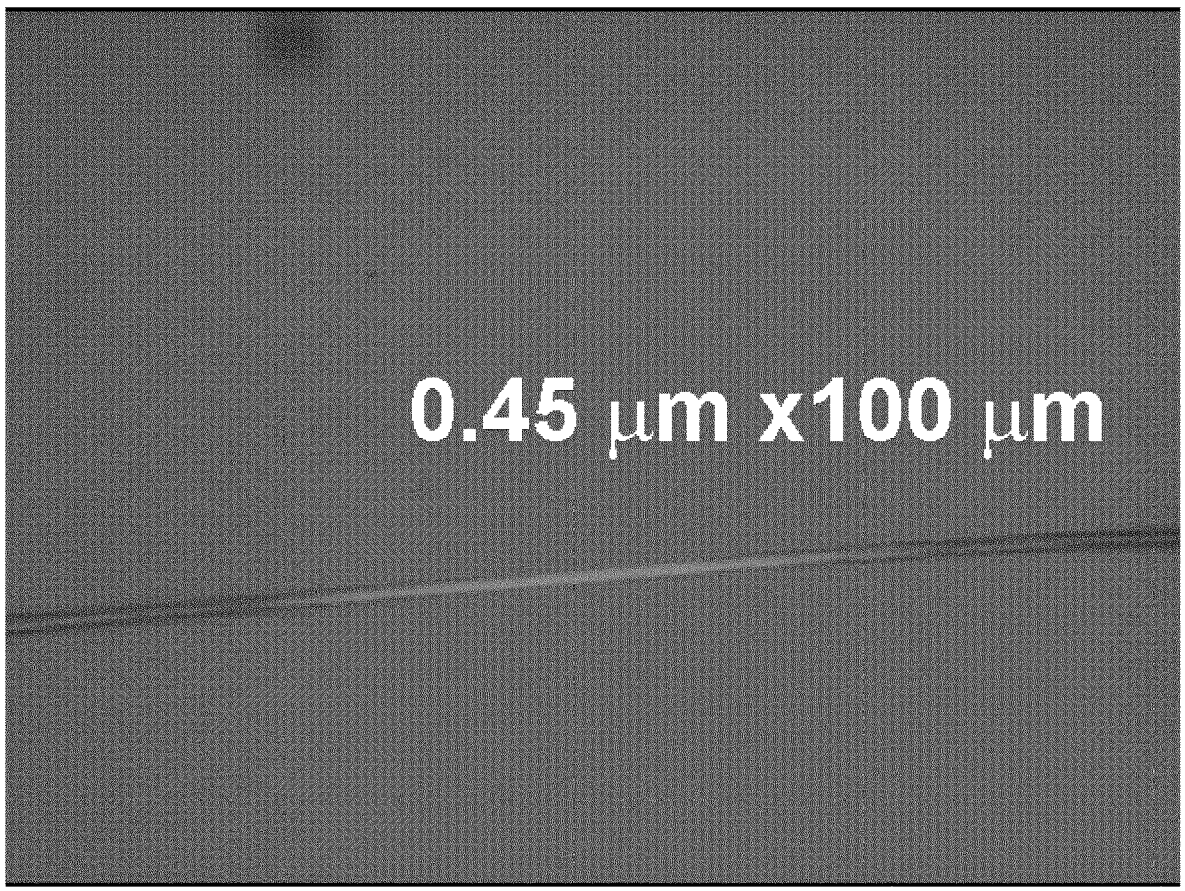
FIG. 7 depicts an optical microscope image of an ultranarrow silver line printed on SU-8/PET substrate using silver (Ag) nano ink.

FIG. 7 depicts an optical microscope image of an ultranarrow silver line printed on SU-8/PET substrate using silver (Ag) nano particle ink. A dog bone pattern was printed using a nano silver ink on uncrosslinked SU-8 and then exposed to 70° C. for 5 minutes. The "dog bone" pattern or "dumbbell pattern" can be any suitable pattern having larger areas of ink at each end of the line. Because the larger areas have a free energy lower than that of the line, the larger areas draw (drain) the ink from the line toward each of the larger areas thus further reducing the width of the line between the large areas.

Figure 8:
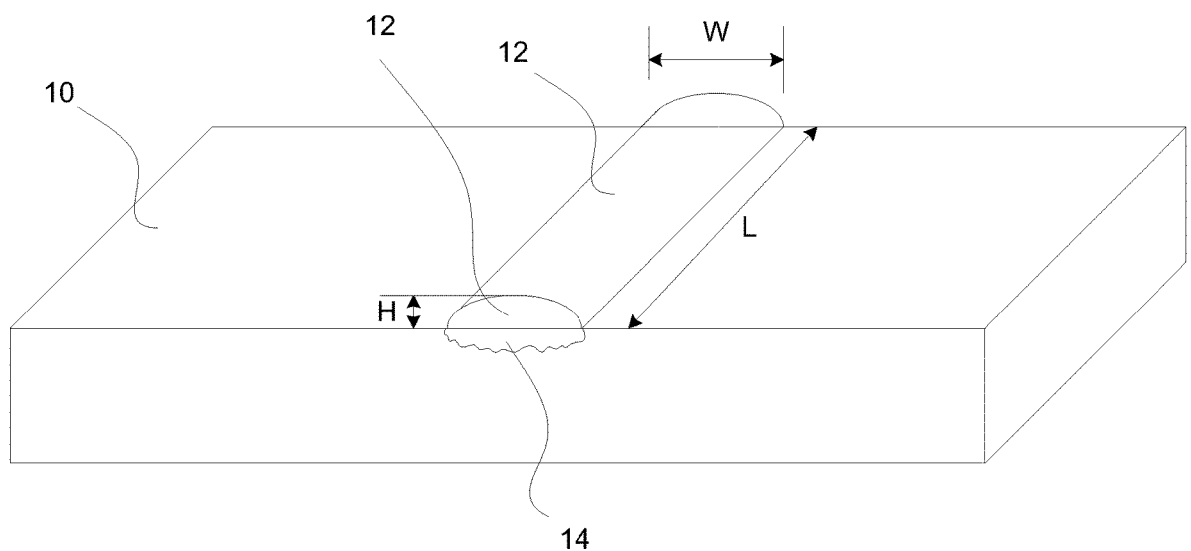
FIG. 8 schematically depicts an ultranarrow line printed by the present method.

Even when combining the draining process with the line-shrinking technique, the key to control line shrinkage to avoid bulging and line breakage is to use a suitable interaction between the ink and the substrate. The selected ink with solvents can slightly dissolve the selected interlayer/substrate, so the constriction of the line (reduction of the printed line width) can be decreased below 10 µm from the initial width of over 30 µm. This results in the sunken or embedded profile depicted schematically in FIG. 8. This figure shows a substrate 10 upon which a solvent-containing ink 12 is printed. The solvent partially dissolves the substrate to cause the ink to sink or embed into the substrate. FIG. 8 shows the sunken portion 14 schematically. By locally and partially dissolving the substrate, the method can achieve ultranarrow line widths of 1.5 µm and 3 µm for Ag printed over a 10 mm length. A further reduction in line width down to a sub-micrometer level has been achieved by implementing the draining mechanism (using the dumbbell or dog bone pattern). A printed Ag line width of 0.45 µm with a length of 100 µm has been demonstrated using the combination of these two techniques. In one embodiment, the method further entails inactivating the surfactant to further reduce the width of the line. Inactivating the surfactant achieves de-wetting and thus line shrinkage. Any chemical that can cut a surfactant molecule to separate its hydrophilic section from hydrophobic section would work. Chemically, it is also possible to add a catalyst to the ink to degrade the surfactant under certain conditions, such as at elevated temperature or as the ink is exposed to light or other energy.

It is to be understood that the singular forms "a", "an" and "the" include plural referents unless the context clearly dictates otherwise. Thus, for example, reference to "a device" includes reference to one or more of such devices, i.e. that there is at least one device. The terms "comprising", "having", "including" and "containing" are to be construed as open-ended terms (i.e., meaning "including, but not limited to,") unless otherwise noted. All methods described herein can be performed in any suitable order unless otherwise indicated herein or otherwise clearly contradicted by context. The use of examples or exemplary language (e.g. "such as") is intended merely to better illustrate or describe embodiments of the invention and is not intended to limit the scope of the invention unless otherwise claimed.

The embodiments of the invention described above are intended to be exemplary only. As will be appreciated by those of ordinary skill in the art, to whom this specification is addressed, many obvious variations, modifications, and refinements can be made to the embodiments presented herein without departing from the inventive concept(s) disclosed herein. The scope of the exclusive right sought by the applicant(s) is therefore intended to be limited solely by the appended claims.

The invention claimed is:

1. A method of printing an ultranarrow line of an electric material, the method comprising:
   providing a substrate having an interlayer on the substrate; and
   printing the ultranarrow line in a single pass by depositing a line of ink on the interlayer of the substrate, the ink comprising the electric or dielectric material and a solvent mixture that partially dissolves the interlayer on the substrate and enables the ink to shrink and sink into the interlayer on the substrate thereby reducing a width of the line to thereby form the ultranarrow line below 10 μm, wherein a height-to-width ratio of the ultranarrow line is 0.70,
   wherein the solvent mixture comprises ethanol, ethylene glycol and glycerol, the ink is a silver nanoparticle ink, the substrate is polyethylene terephtalate (PET) and the interlayer is SU-8 being composed of a fully epoxidized bisphenol-A/formaldehyde novolac co-polymer.

2. The method of claim 1 further comprising thermally treating the ink, interlayer and substrate after printing.

3. The method of claim 2 wherein the ink, interlayer and substrate is thermally treated at a temperature of 60-80° C. for 5 minutes.

4. The method of claim 2 wherein the ink, interlayer and substrate is thermally treated at 40-60° C. initially and then at 75-90° C.

5. The method of claim 2 wherein the ink, interlayer and substrate is thermally treated by ramping from 40 to 90° C.

6. The method of claim 1 further comprising draining ink longitudinally along the line by depositing larger areas of ink at ends of the line, the larger areas having a free energy lower than that of the line, thereby enabling the ink to drain toward the larger areas thus further reducing the width of the ultranarrow line.

7. The method of claim 1 wherein printing is performed using an inkjet printer and the line width of the ultranarrow line is below 10 μm.

8. The method of claim 1 wherein the ultranarrow line is printed to define a gate of a transistor of a printable electronic device.

9. The method of claim 1 further comprising controlling a surface tension of the ink while drying to remain less than a surface tension of the substrate upon which the ink is drying.

10. The method of claim 1 further comprising inactivating a surfactant to further reduce the width of the ultranarrow line.

11. The method of claim 1 wherein the solvent mixture has a surface energy that changes during evaporation/drying.

* * * * *